(12) United States Patent
Pelella (10) Patent No.: US 7,361,534 B2
(45) Date of Patent: Apr. 22, 2008

(54) METHOD FOR FABRICATING SOI DEVICE

(75) Inventor: Mario M. Pelella, Mountain View, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 449 days.

(21) Appl. No.: 11/127,329

(22) Filed: May 11, 2005

(65) Prior Publication Data

US 2006/0258110 A1    Nov. 16, 2006

(51) Int. Cl.
*H01L 21/84* (2006.01)

(52) U.S. Cl. .................. 438/152; 438/200; 438/237; 257/350; 257/357; 257/E21.704; 257/E21.415

(58) Field of Classification Search ............... 438/152, 438/200, 237; 257/350, 357, E21.704, E21.415, 257/E27.112
See application file for complete search history.

(56) References Cited

U.S. PATENT DOCUMENTS

| | | | |
|---|---|---|---|
| 5,847,419 A | | 12/1998 | Imai et al. |
| 5,869,379 A | * | 2/1999 | Gardner et al. ............. 438/305 |
| 5,869,872 A | * | 2/1999 | Asai et al. ................. 257/360 |
| 6,124,615 A | * | 9/2000 | Lee ............................ 257/349 |
| 6,407,429 B1 | | 6/2002 | Ko et al. |
| 6,611,024 B2 | * | 8/2003 | Ang et al. .................. 257/350 |
| 6,835,662 B1 | | 12/2004 | Erhardt et al. |
| 2002/0022328 A1 | | 2/2002 | Ang et al. |
| 2002/0119608 A1 | * | 8/2002 | Ko et al. ................... 438/152 |
| 2002/0175378 A1 | * | 11/2002 | Choe et al. ................ 257/355 |
| 2004/0043590 A1 | * | 3/2004 | Bonser et al. ............. 438/585 |
| 2005/0269642 A1 | * | 12/2005 | Minami ..................... 257/355 |

FOREIGN PATENT DOCUMENTS

| | | |
|---|---|---|
| EP | 0364393 | 4/1990 |
| JP | 11238860 | 8/1999 |

OTHER PUBLICATIONS

International Search Report for PCT/US2006/014626, mailed Aug. 16, 2006.

* cited by examiner

*Primary Examiner*—B. William Baumeister
*Assistant Examiner*—Steven J. Fulk
(74) *Attorney, Agent, or Firm*—Ingrassia Fisher & Lorenz, P.C.

(57) ABSTRACT

A method is provided for fabricating a semiconductor on insulator (SOI) device. The method includes, in one embodiment, providing a monocrystalline silicon substrate having a monocrystalline silicon layer overlying the substrate and separated therefrom by a dielectric layer. A gate electrode material is deposited and patterned to form a gate electrode and a spacer. Impurity determining dopant ions are implanted into the monocrystalline silicon layer using the gate electrode as an ion implant mask to form spaced apart source and drain regions in the monocrystalline silicon layer and into the monocrystalline silicon substrate using the spacer as an ion implant mask to form spaced apart device regions in the monocrystalline substrate. Electrical contacts are then formed that contact the spaced apart device regions.

8 Claims, 7 Drawing Sheets

METHOD FOR FABRICATING SOI DEVICE

TECHNICAL FIELD

The present invention generally relates to a method for fabricating semiconductor on insulator (SOI) devices, and more particularly relates to a method for fabricating SOI integrated circuits having devices in both the thin SOI layer and the substrate.

BACKGROUND

The majority of present day integrated circuits (ICs) are implemented by using a plurality of interconnected field effect transistors (FETs), also called metal oxide semiconductor field effect transistors (MOSFETs or MOS transistors). The ICs are usually formed using both P-channel and N-channel FETs and the IC is then referred to as a complementary MOS or CMOS circuit. Certain improvements in performance of FET ICs can be realized by forming the FETs in a thin layer of semiconductor material overlying an insulator layer. Such semiconductor on insulator (SOI) FETs, for example, exhibit lower junction capacitance and hence can operate at higher speeds. It is advantageous in certain applications, however, to fabricate at least some devices in the semiconductor substrate that supports the insulator layer. The devices formed in the substrate, for example, may have better thermal properties and can support higher voltages than devices formed in the thin semiconductor layer.

As the complexity of the integrated circuits increases, more and more MOS transistors are needed to implement the integrated circuit function. As more and more transistors are designed into the IC, it becomes important to shrink the size of individual MOS transistors so that the size of the IC remains reasonable and the IC can be reliably manufactured. Shrinking the size of an MOS transistor implies that the minimum feature size, that is, the minimum width of a line or the minimum spacing between lines, is reduced. MOS transistors have now been aggressively reduced to the point at which the gate electrode of the transistor is less than or equal to 45 nanometers (nm) in width. Methods previously used to fabricate devices in the substrate of an SOI structure, however, have not be able to achieve the same minimum feature size in substrate devices as are realized in the devices formed in the thin semiconductor layer.

Accordingly, it is desirable to provide a method for fabricating SOI devices having minimum feature size. In addition, it is desirable to provide a self aligned method for fabricating SOI devices having minimum feature size substrate devices. Furthermore, other desirable features and characteristics of the present invention will become apparent from the subsequent detailed description and the appended claims, taken in conjunction with the accompanying drawings and the foregoing technical field and background.

BRIEF SUMMARY

A method is provided for fabricating a semiconductor on insulator (SOI) device. The method includes, in one embodiment, providing a monocrystalline silicon substrate having a monocrystalline silicon layer overlying the substrate and separated therefrom by a dielectric layer. A gate electrode material is deposited and patterned to form a gate electrode and a spacer. Impurity determining dopant ions are implanted into the monocrystalline silicon layer using the gate electrode as an ion implant mask to form spaced apart source and drain regions in the monocrystalline silicon layer and into the monocrystalline silicon substrate using the spacer as an ion implant mask to form spaced apart device regions in the monocrystalline substrate. Electrical contacts are then formed that contact the spaced apart device regions.

BRIEF DESCRIPTION OF THE DRAWINGS

The present invention will hereinafter be described in conjunction with the following drawing figures, wherein like numerals denote like elements, and wherein FIG. 1-11 schematically illustrate, in cross section, process steps in accordance with various embodiments of the invention.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

FIGS. 1-11 schematically illustrate method steps for the manufacture of a CMOS integrated circuit 20 in accordance with various embodiments of the invention. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. In these illustrative embodiments only a small portion of CMOS integrated circuit 20 is illustrated. Various steps in the manufacture of CMOS devices are well known and so, in the interest of brevity, many conventional steps will only be mentioned briefly herein or will be omitted entirely without providing the well known process details. Although in this illustrative embodiment integrated circuit 20 is a CMOS circuit, the invention is also applicable to the fabrication of a single channel type MOS circuit.

Figure 1:
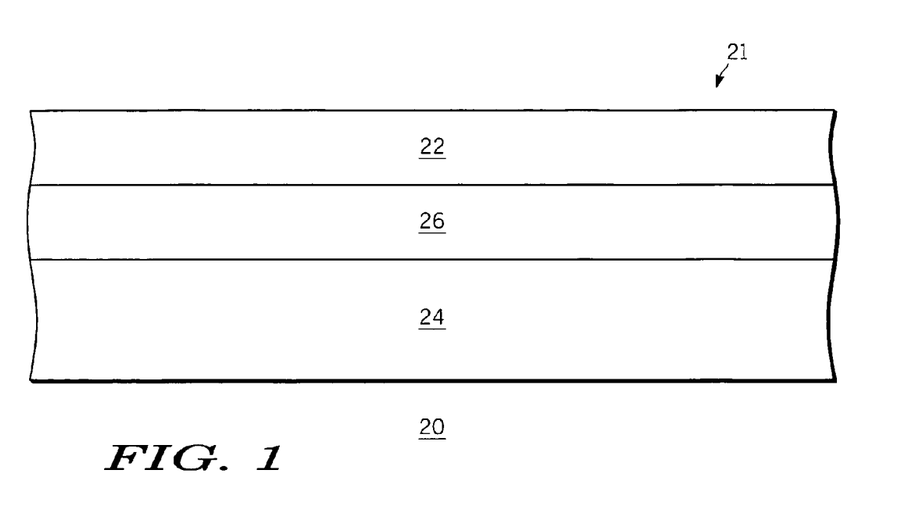

As illustrated in FIG. 1, the method in accordance with one embodiment of the invention begins with providing a semiconductor substrate 21. The semiconductor substrate is preferably a silicon substrate with a monocrystalline silicon layer 22 formed overlying a monocrystalline silicon carrier substrate 24. As used herein, the terms "silicon layer" and "silicon substrate" will be used to encompass the relatively pure monocrystalline silicon materials typically used in the semiconductor industry as well as silicon admixed with other elements such as germanium, carbon, and the like to form substantially monocrystalline semiconductor material. Monocrystalline silicon layer 22 will be used in the formation of N-channel and P-channel MOS transistors. Monocrystalline silicon substrate 24 will be used for the formation of a substrate device herein illustrated as a PN junction diode. Monocrystalline silicon layer 22 can be formed, for example, by the well known layer transfer technique. In that technique hydrogen is implanted into a subsurface region of an oxidized monocrystalline silicon wafer. The implanted wafer is then flip bonded to monocrystalline silicon substrate 24. A two phase heat treatment is then carried out to split the hydrogen implanted wafer along the implanted region and to strengthen the bonding, leaving a thin monocrystalline silicon layer 22 bonded to the monocrystalline silicon substrate and separated from the substrate by a dielectric insulating layer 26. The monocrystalline silicon layer is then thinned and polished, for example by chemical mechanical planarization (CMP) techniques, to a thickness of about 50-300 nanometers (nm) depending on the circuit function being implemented. Both the monocrystalline silicon layer and the monocrystalline silicon carrier substrate preferably have a resistivity of at least about 1-35 Ohms per square. The silicon can be impurity doped either N-type or P-type, but is preferably doped P-type. Dielectric insulating layer 26, typically silicon dioxide, preferably has a thickness of about 50-200 nm.

As one alternative to the wafer bonding technique, monocrystalline semiconductor substrate 21 can be formed by the SIMOX process. The SIMOX process is a well known process in which oxygen ions are implanted into a sub-surface region of monocrystalline silicon substrate 24. The monocrystalline silicon substrate and the implanted oxygen are subsequently heated to form a sub-surface silicon oxide dielectric layer 26 that electrically isolates SOI layer 22 from the remaining portion of monocrystalline silicon substrate 24. The thickness of SOI layer 22 is determined by the energy of the implanted ions. Dielectric layer 26 is commonly referred to as a buried oxide or "BOX" and will so be referred to herein.

Figure 2:
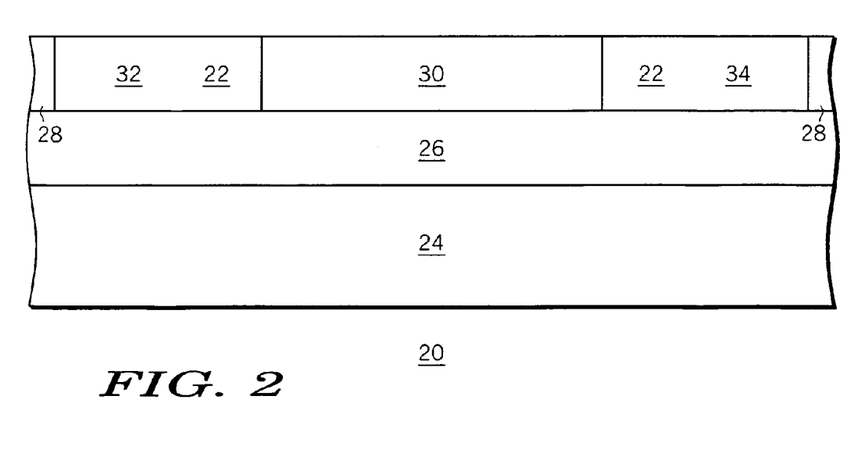

Having provided a semiconductor substrate 21, the method in accordance with one embodiment of the invention continues as illustrated in FIG. 2 by the formation of dielectric isolation regions 28, 30 extending through monocrystalline silicon layer 22 to dielectric layer or BOX 26. The dielectric isolation regions are preferably formed by the well known shallow trench isolation (STI) technique in which trenches are etched into monocrystalline silicon layer 22, the trenches are filled with a dielectric material such as deposited silicon dioxide, and the excess silicon dioxide is removed by CMP. STI regions 28 provide electrical isolation, as needed, between various devices of the CMOS circuit that are to be formed in monocrystalline silicon layer 22. In accordance with an embodiment of the invention, STI region 30 aids in electrically isolating the device to be formed in carrier substrate 24 from the devices to be formed in monocrystalline silicon layer 22. Either before or after the formation of dielectric isolation regions 28, 30, portions of monocrystalline silicon layer 22 can be doped, for example by ion implantation, to form P-type regions 32 and N-type regions 34.

Figure 3:
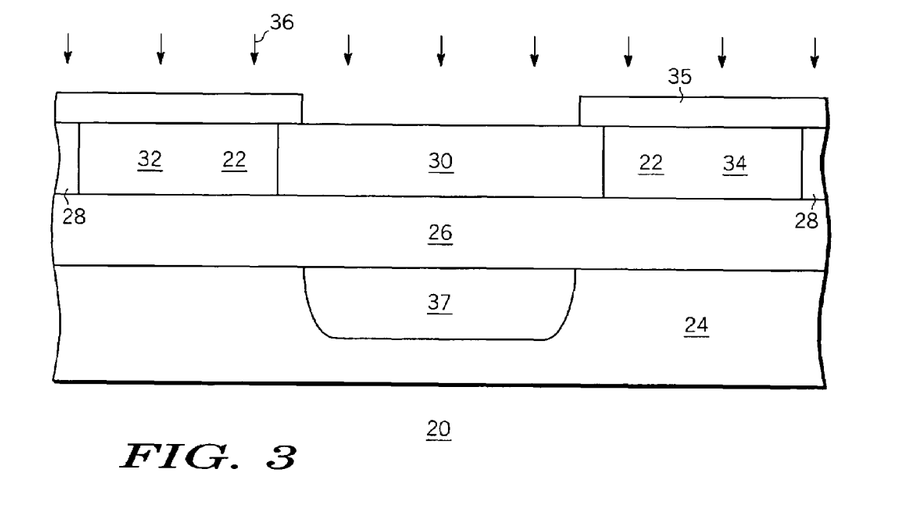

In accordance with one embodiment of the invention, a layer 35 of photoresist is applied overlying the surface of monocrystalline silicon layer 22 and dielectric isolation regions 28, 30. The layer of photoresist is patterned to expose a portion of dielectric isolation region 30 as illustrated in FIG. 3. The patterned photoresist is used as an ion implantation mask and conductivity determining ionic impurities are implanted, as indicated by arrows 36, into the surface of monocrystalline silicon substrate 24 to form a doped region 37. For example, phosphorus ions can be implanted into the monocrystalline silicon substrate at an energy of about 200-300 KeV and dose of about $1\times10^{13}$-$2\times10^{14}$ cm$^{-2}$ to form an N-type doped region 37.

Figure 4:
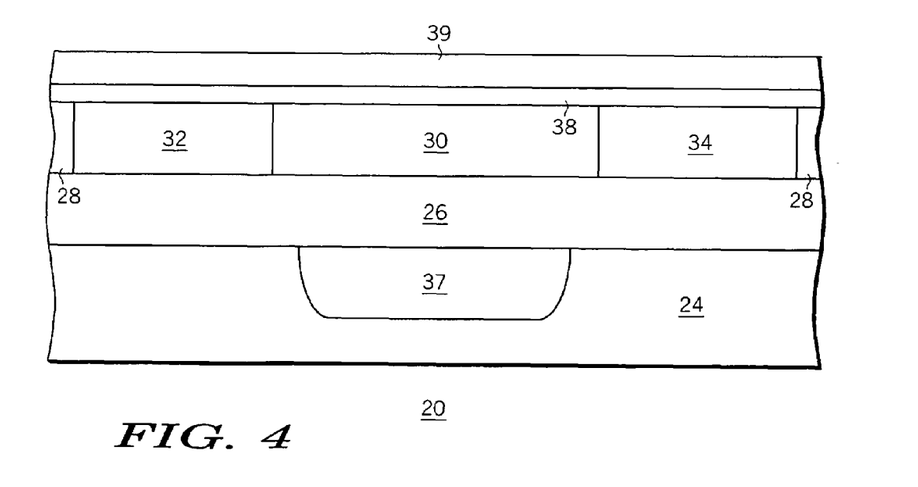

As illustrated in FIG. 4, after removing layer 35 of photoresist, a layer of gate insulator material 38 is grown or deposited on the surface of silicon layer 22. The gate insulator may be a thermally grown silicon dioxide formed by heating the silicon substrate in an oxidizing ambient, or may be a deposited insulator such as a silicon oxide, silicon oxynitride, silicon nitride, a high dielectric constant insulator such as HfSiO, or the like. Deposited insulators can be deposited by chemical vapor deposition (CVD), low pressure chemical vapor deposition (LPCVD), or plasma enhanced chemical vapor deposition (PECVD). The gate insulator material is typically 1-10 nanometers (nm) in thickness. As illustrated, gate insulator material 38 is a deposited layer that is deposited onto both the dielectric isolation regions 28, 30 and the remaining monocrystalline silicon layer 22. As is well known, a grown thermal oxide would be grown only on the monocrystalline silicon layer. A layer 39 of gate electrode forming material such as polycrystalline silicon is deposited overlying gate insulator material 38, monocrystalline silicon layer 22, and the dielectric isolation regions 28, 30. Layer 39 will hereinafter be referred to as a polycrystalline silicon layer although those of skill in the art will recognize that other conductive materials could be used as the gate electrode material. The layer of polycrystalline silicon is preferably deposited as undoped polycrystalline silicon and is subsequently impurity doped by ion implantation.

Figure 5:
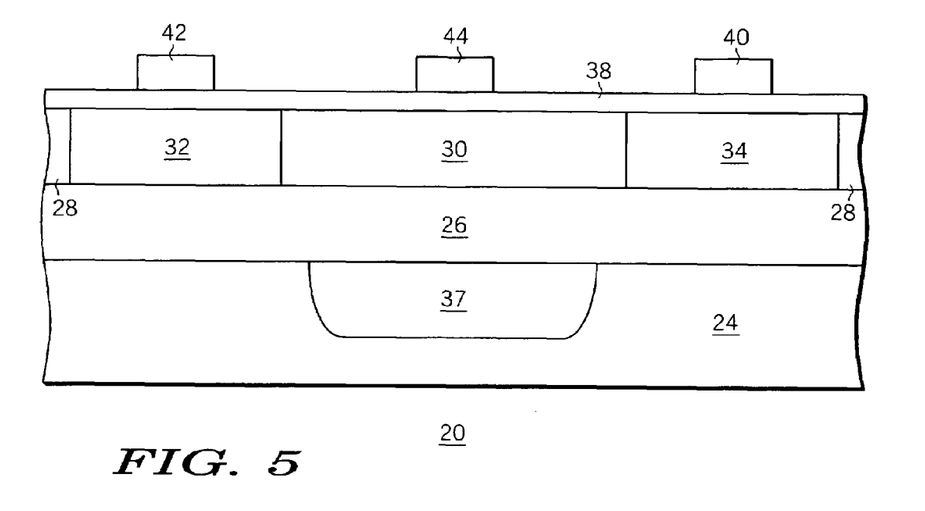

The method in accordance with an embodiment of the invention proceeds as illustrated in FIG. 5. Polycrystalline gate electrode layer 39 is patterned and etched to form a P-channel gate electrode 40 overlying N-type region 34 of monocrystalline silicon layer 22, an N-channel gate electrode 42 overlying P-type region 32 of monocrystalline silicon layer 22 and a spacer 44 overlying dielectric isolation region 30. The etching of polycrystalline gate electrodes is well advanced in the art so that gate lengths of only 45 nm or less can be achieved. Polycrystalline silicon gate electrode layer 39 is preferably etched using such well know and advanced patterning and etching techniques to preferably obtain gate electrodes 40 and 42 and spacer 44, each having minimum feature size. Such advanced patterning and etching techniques generally involve patterning and etching the polycrystalline silicon using the minimum available photolithography exposure feature size followed by isotropically etching the polycrystalline silicon to further reduce the width of the resulting structure.

Figure 6:
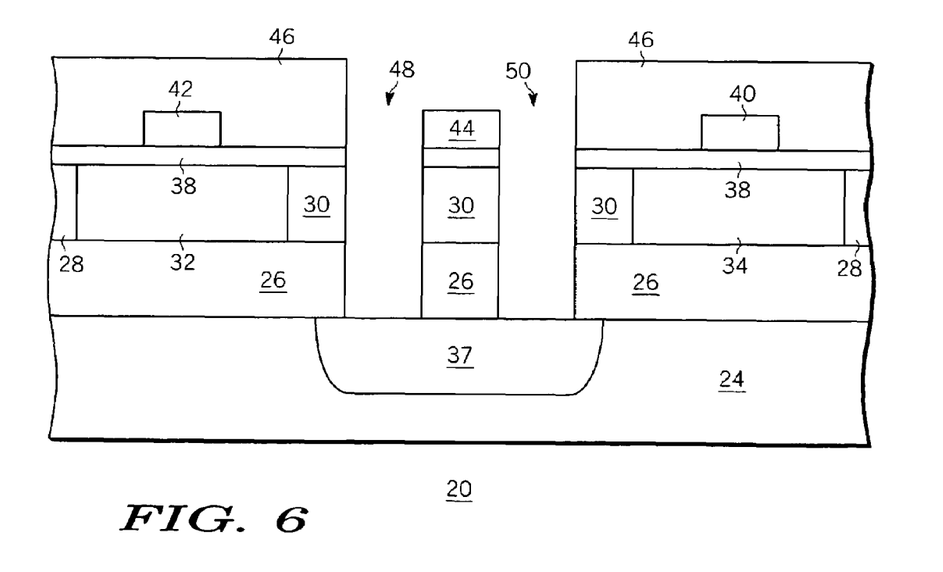

As illustrated in FIG. 6, a layer 46 of photoresist is applied to the structure and is patterned to expose a portion of dielectric isolation region 30 and spacer 44. In accordance with an embodiment of the invention, the patterned layer of photoresist and spacer 44 are used together as an etch mask to etch openings 48 and 50 through dielectric isolation region 30 and dielectric insulating layer 26 and to expose portions of impurity doped region 37. Openings 48 and 50 are anisotropically etched through dielectric isolation region 30 and dielectric insulating layer 26, preferably by reactive ion etching. The dielectric layers can be reactive ion etched, for example, using a $CF_4$ or $CHF_3$ chemistry. The spacing between openings 48 and 50 is determined, not by the spacing of openings in layer 46 of photoresist, but by the width of spacer 44 and hence, in accordance with an embodiment of the invention, is comparable to the minimum feature size. The spacing between openings 48 and 50 can thus be less than the minimum photolithographic feature spacing otherwise attainable through photolithographic patterning and etching alone.

Figure 7:
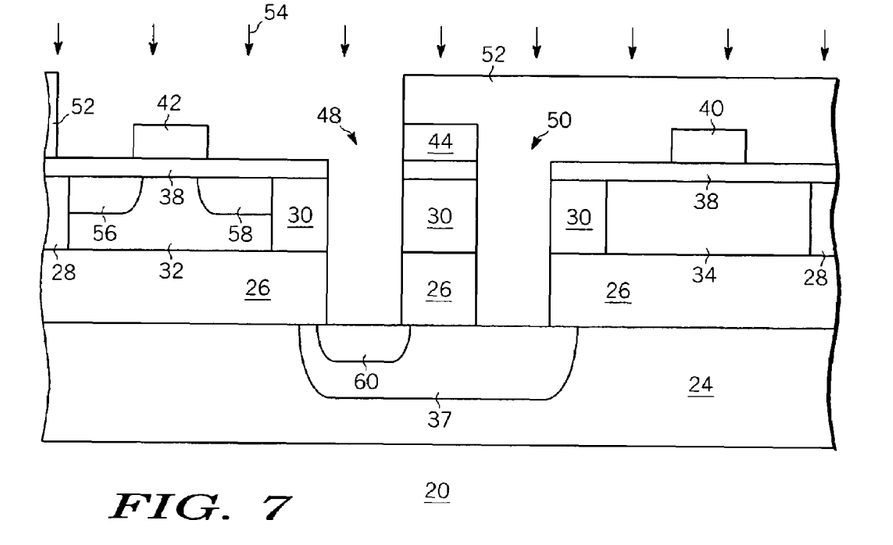

After removing layer 46 of photoresist another layer 52 of photoresist can next be applied to the structure and patterned to expose one of openings 48 and 50 while masking the other of the openings. The photoresist layer is also patterned to expose one of regions 32 and 34 while masking the other of the regions. As illustrated in FIG. 7, photoresist layer 52 has been patterned to expose opening 48 and P-type region 32. Patterned photoresist layer 52 is used as an ion implantation mask and N-type impurity dopant ions, preferably arsenic ions, are implanted into the exposed areas as indicated by arrows 54. The N-type impurity dopant ions form source 56 and drain 58 regions of an N-channel MOS transistor that are self aligned with gate electrode 42 and a cathode region 60 self aligned with one edge of spacer 44.

Figure 8:
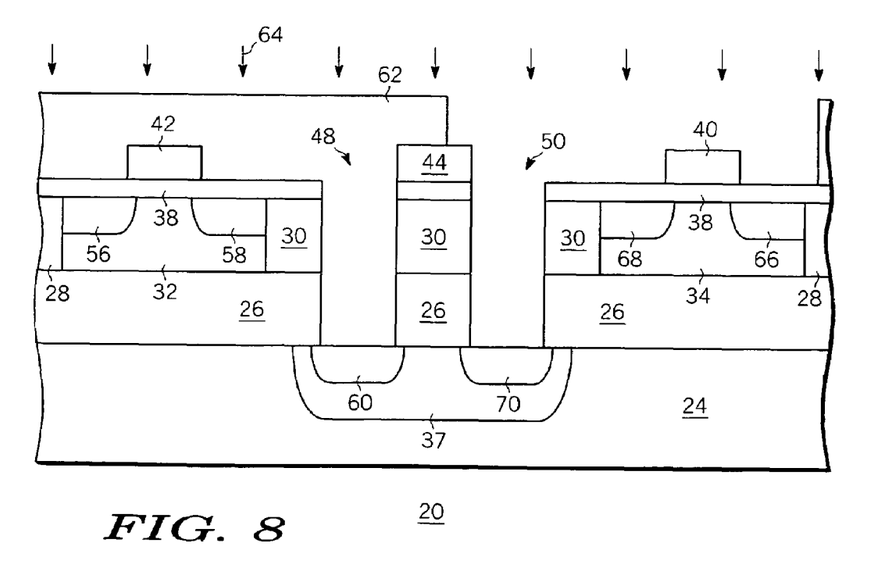

Layer 52 of photoresist is removed and another layer 62 of photoresist is applied to the structure and is patterned to expose the other of openings 48 and 50 and the other of regions 32 and 34 while masking the previously exposed opening and region. As illustrated in FIG. 8, photoresist layer 62 is patterned to expose opening 50 and region 34. Patterned photoresist layer 62 is used as an ion implantation mask and P-type impurity dopant ions, preferably boron ions, are implanted into the exposed areas as indicated by arrows 64. The P-type impurity dopant ions form source 66 and drain 68 regions of a P-channel MOS transistor that are self aligned with gate electrode 40 and an anode region 70 self aligned with the other edge of spacer 44. Photoresist layer 52 is removed and the ion implanted regions are heated, preferably by rapid thermal annealing, to activate the implanted ions. Other conventional method steps (not illustrated) such as the formation of sidewall spacers on the gate electrodes, implantation of additional source and drain regions, removal of gate insulator material that is not disposed under a gate electrode, and the like, may now be carried out to complete the processing of the MOS transistors.

Figure 9:
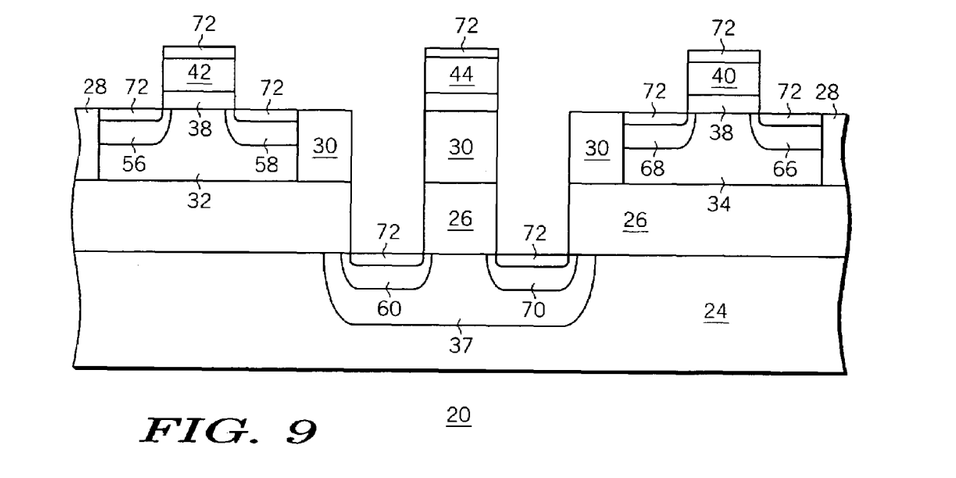

In accordance with an embodiment of the invention a layer of silicide forming metal such as nickel, cobalt, titanium, palladium, or the like is deposited onto the structure and in contact with the ion implanted source, drain, anode and cathode regions as well as to gate electrodes 40 and 42. The silicide forming metal preferably has a thickness of about 5-15 nm. The silicide forming metal is heated, preferably to a temperature of about 350°-500° C. to cause the metal to react with the silicon with which it is in contact to form a metal silicide contact region 72 at the surface of each of the ion implanted regions and on the gate electrodes as illustrated in FIG. 9. The metal that is not in contact with silicon, for example the metal that is deposited on the dielectric isolation regions, does not react during the heating step and is removed, for example by wet etching in a $H_2O_2/H_2SO_4$ or $HNO_3/HCl$ solution.

Figure 10:
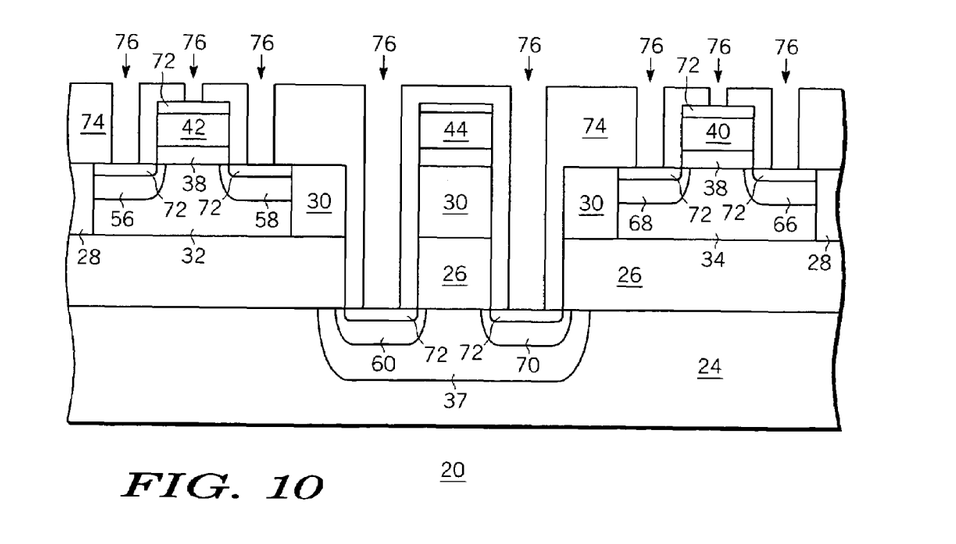

As illustrated in FIG. 10 a layer 74 of insulating material is deposited and planarized to cover the contact regions. The insulating material can be deposited, for example, by low pressure chemical vapor deposition using a tetraethylorthosilicate source. Layer 74 is preferably planarized by CMP. Following the planarization, a layer of photoresist (not illustrated) is applied to the surface of the planarized insulating material and is used as an etch mask to etch contact openings 76 that extend through the insulating material to the metal silicide contact regions.

Figure 11:
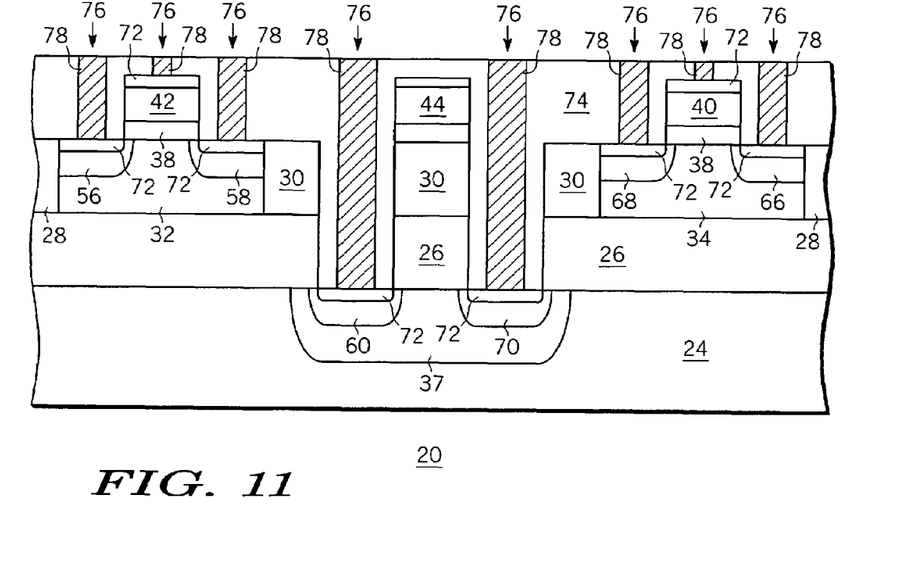

Contact plugs 78 are formed in each of contact openings 76 to allow electrical contact to the various device regions. The contact plugs can be formed, for example, by depositing successive layers of titanium, titanium nitride, and tungsten in known manner. The excess metal layers can then be removed by CMP to leave contact plugs 78 as illustrated in FIG. 11. Those of skill in the art will understand that contact openings 76 and contact plugs 78 may not be needed to contact each and every one of the silicide contact regions, but rather that such contacting will be dictated by the details of the circuit being implemented.

Those of skill in the art will appreciate that alternative and/or additional steps may be used to fabricate integrated circuit 20 and the order of the method steps may be changed without departing from the broad scope of the invention. For example, sidewall spacers may be formed at the edges of the gate electrodes and those spacers may be used as masks for additional ion implantations or to space the metal silicide contacts apart from the gate electrodes.

Figure 12:
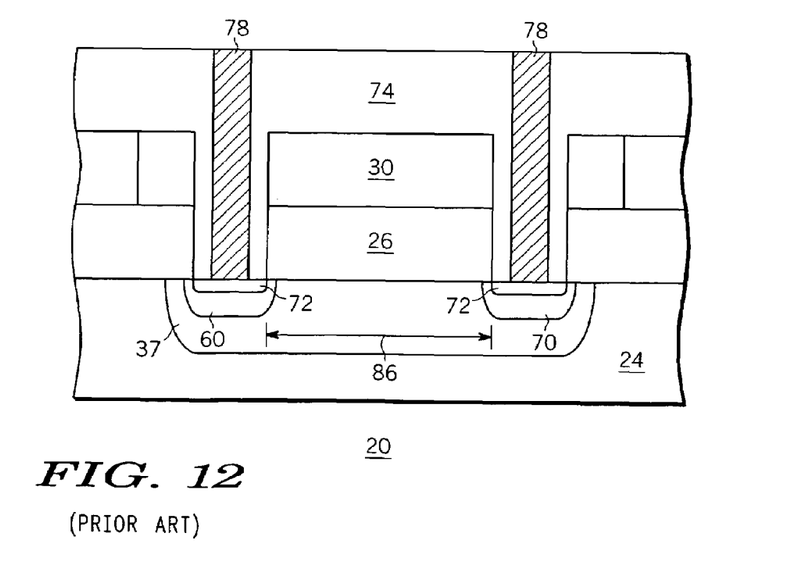
FIG. 12 illustrates, in cross section, a prior art substrate diode.
Figure 13:
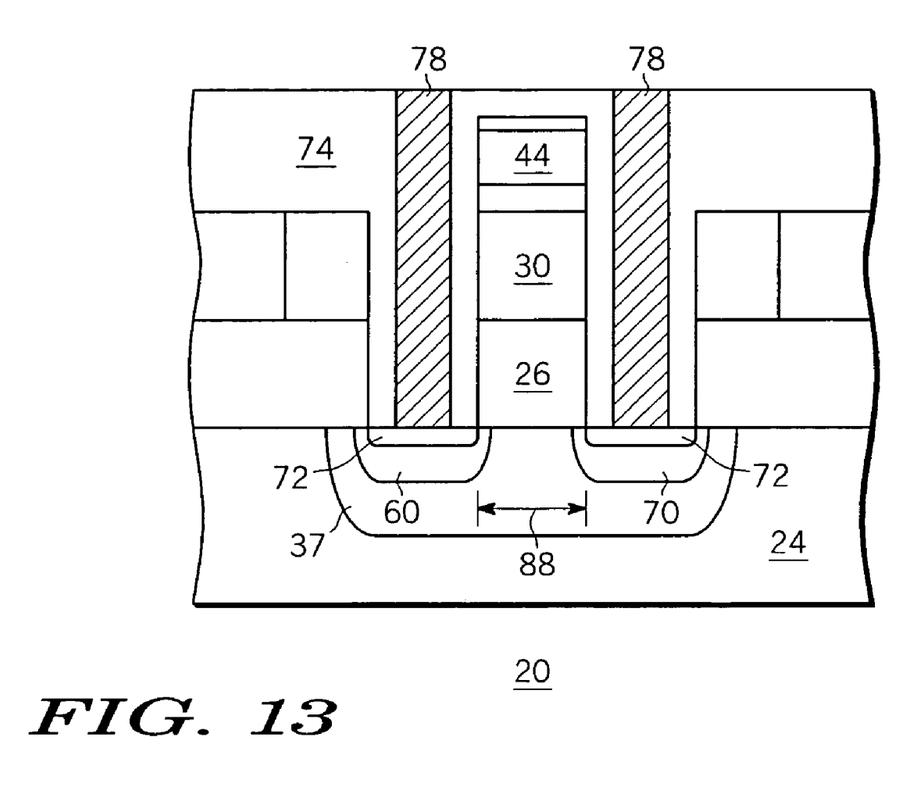
FIG. 13 schematically illustrates, in cross section, a substrate diode in accordance with an embodiment of the invention.

Prior SOI integrated circuits have included diodes fabricated in the monocrystalline silicon substrate as well as other circuit components formed in the thin monocrystalline silicon layer overlying an insulating layer, but in fabricating such circuits the anode and cathode regions have been defined in the substrate by patterning and etching the overlying thin silicon layer and the insulating layer using conventional photolithography techniques. That is, the anode and cathode regions were defined by separate mask patterns that were, at best, spaced apart by a distance equal to the minimum feature size. By fabricating substrate devices using an embodiment of the invention, it is possible to reduce the spacing between regions in the substrate to a distance equal to the width of the minimum achievable gate length. The benefit that can be realized by fabricating substrate devices in accordance with an embodiment of the invention can be seen by comparing a substrate diode fabricated by the conventional method, as illustrated in FIG. 12 with the substrate diode fabricated in accordance with an embodiment of the invention as illustrated in FIG. 13. In FIGS. 12 and 13 only the diode portion of the SOI integrated circuit is illustrated. In FIG. 13, the same numbering has been used as was used in FIG. 11; corresponding regions in FIG. 12 have been given the same numbers. The spacing between the anode and the cathode of the prior art device, indicated by double headed arrow 86, is two and one half to five times the spacing, indicated by the double headed arrow 88, between the anode and the cathode of the diode fabricated in accordance with an embodiment of the invention.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating a semiconductor on insulator (SOI) device having a monocrystalline silicon layer overlying a monocrystalline silicon substrate and separated therefrom by a dielectric layer, the method comprising the steps of:

ion implanting a well region in the monocrystalline silicon substrate;

depositing a gate electrode material overlying the monocrystalline silicon layer;

providing a patterned mask overlying the gate electrode material, wherein the patterned mask comprises openings of a minimum lithography feature size;

etching the gate electrode material to form a first gate electrode, a second gate electrode and a spacer having the minimum lithography feature size;

then isotropically etching the gate electrode material to reduce the width of the first gate electrode, the second gate electrode and the spacer;

ion implanting N-type impurity determining dopant ions into the well region of the monocrystalline silicon substrate using the spacer as an ion implant mask to form an N-type device region in the well region of the monocrystalline silicon substrate and into the monocrystalline silicon layer using the first gate electrode as an ion implant mask to form N-channel source and drain regions in the monocrystalline silicon layer; and ion implanting P-type impurity determining dopant ions into the well region of the monocrystalline silicon substrate using the spacer as an ion implant mask to form a P-type device region in the well region of the monocrystalline silicon substrate and into the monocrystalline silicon layer using the second gate electrode as an ion implant mask to form P-channel source and drain regions in the monocrystalline silicon layer.

2. A method for fabricating a semiconductor on insulator (SOI) device having a monocrystalline silicon layer overlying a monocrystalline silicon substrate and separated therefrom by a dielectric layer, the method comprising the steps of:

forming a dielectric isolation region extending through the monocrystalline silicon layer to the dielectric layer;

depositing a layer of gate electrode material overlying the monocrystalline silicon layer and the dielectric isolation region;

patterning the layer of gate electrode material to simultaneously form a gate electrode overlying the monocrystalline silicon layer and a spacer overlying the dielectric isolation region, wherein the gate electrode and the spacer each have a minimum width;

etching the dielectric isolation region and the dielectric layer using the spacer as an etch mask; and ion implanting impurity determining dopant ions using the spacer as an ion implantation mask to form spaced apart device regions in the monocrystalline silicon substrate and using the gate electrode as another ion implantation mask to form source and drain regions in the monocrystalline silicon layer proximate the gate electrode.

3. The method of claim 2 wherein the step of ion implanting impurity determining dopant ions to form spaced apart device regions comprises the steps of:

ion implanting a P-type region to form an anode of a substrate diode; and ion implanting an N-type region to form a cathode of a substrate diode.

4. The method of claim 2 further comprising the step of forming a metal silicide layer on the spaced apart device regions.

5. The method of claim 4 further comprising the steps of:

depositing a layer of insulating material overlying the metal silicide layer;

planarizing the layer of insulating material;

etching openings through the layer of insulating material to expose the metal silicide layer; and forming electrical contacts in the openings to electrically contact the device regions.

6. A method for fabricating a semiconductor on insulator (SOI) device having a monocrystalline silicon layer overlying a monocrystalline silicon substrate and separated therefrom by a dielectric layer, the method comprising the steps of:

forming a dielectric isolation region extending through the monocrystalline silicon layer to the dielectric layer;

ion implanting a well region in the monocrystalline silicon substrate;

depositing a gate electrode layer overlying the monocrystalline silicon layer and the dielectric isolation region;

patterning the gate electrode layer using a photolithographic patterning and etching process to form a P-channel gate electrode and an N-channel gate electrode overlying the monocrystalline silicon layer and a spacer overlying the dielectric isolation region, wherein the P-channel gate electrode, the N-channel gate electrode, and the spacer each have a minimum photolithographic feature size;

subsequently isotropically etching the spacer to reduce the minimum photolithographic feature size;

etching through the dielectric isolation region and the dielectric layer using the spacer as an etch mask to expose an anode region and a cathode region spaced apart in the well region of the monocrystalline silicon substrate;

implanting P-type impurity dopants into the monocrystalline silicon layer to form source and drain regions of a P-channel MOS transistor proximate the P-channel gate electrode and into the anode region in the monocrystalline silicon substrate to form an anode of a substrate diode;

implanting N-type impurity dopants into the monocrystalline silicon layer to form source and drain regions of an N-channel MOS transistor proximate the N-channel gate electrode and into the cathode region in the monocrystalline silicon substrate to form a cathode of a substrate diode;

forming a metal silicide in electrical contact with the anode and the cathode;

depositing an electrically insulating layer overlying the metal silicide;

etching contact openings extending through the electrically insulating layer to expose a portion of the metal silicide; and forming electrical contacts contacting the anode and the cathode through the contact openings.

7. The method of claim 6 further comprising the step of planarizing the electrically insulating layer.

8. The method of claim 6 wherein the step of forming electrical contacts comprises the step of forming conductive plugs filling the contact openings.

* * * * *